US012565714B2

(12) United States Patent
Shimizu et al.

(10) Patent No.: US 12,565,714 B2
(45) **Date of Patent: *Mar. 3, 2026**

(54) FILM FORMATION METHOD

(71) Applicant: FLOSFIA INC., Kyoto (JP)

(72) Inventors: Makoto Shimizu, Tokyo (JP); Hiroshi Shiho, Tokyo (JP); Hiroyuki Ando, Kyoto (JP); Naoyuki Tsukamoto, Kyoto (JP); Yuji Kato, Kyoto (JP)

(73) Assignee: FLOSFIA, INC., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/603,541

(22) Filed: Mar. 13, 2024

(65) Prior Publication Data

US 2024/0309556 A1 Sep. 19, 2024

(30) Foreign Application Priority Data

Mar. 13, 2023 (JP) ................................ 2023-039132

(51) Int. Cl.

*C30B 29/54* (2006.01)
*C30B 25/18* (2006.01)

(52) U.S. Cl.

CPC .............. *C30B 29/54* (2013.01); *C30B 25/18* (2013.01)

(58) Field of Classification Search

CPC ...... B05D 1/60; B05D 1/005; B05D 2203/30; C09D 4/00; C07F 15/00; C23C 16/40; C23C 16/44; C23C 16/06; C23C 16/56; C23C 16/4486; H01L 21/02414; H01L 21/0242; H01L 21/02581; H01L 21/02565; H01L 21/02433; H01L 21/02579;

(Continued)

(56) References Cited

U.S. PATENT DOCUMENTS 11,312,730 B2 * 4/2022 Fang ........................ C23C 16/40
12,060,370 B2 * 8/2024 Leoncini ............... C23C 16/405
12,177,972 B2 * 12/2024 Fujimura ................ H01L 23/36

(Continued)

FOREIGN PATENT DOCUMENTS

EP 2045359 A1 * 4/2009 ............ B01J 21/066
JP 02-018926 1/1990

(Continued)

OTHER PUBLICATIONS

Oshima et al., "Epitaxial growth of wide-band-gap-ZnGa2O4 films by mist chemical vapor deposition," J. Cryst. Growth, 386 (2014) 190-193. (Year: 2014).*

(Continued)

*Primary Examiner* — William P Fletcher, III

(74) *Attorney, Agent, or Firm* — Wenderoth, Lind & Ponack, L.L.P.

(57) ABSTRACT

A film formation method having an excellent mass productivity, whereby a time required for forming a film having a desired thickness is short. In the film formation method, at least one of a metal complex having two or more different ligands, and a metal complex having same ligands and substituents is used, and the method includes atomizing or dropletizing a liquid containing the metal complex, conveying resulting mist or droplets to a base by a carrier gas, and forming a metal oxide film on the base by thermally reacting the mist or droplets in the vicinity of the base.

12 Claims, 1 Drawing Sheet

(58) Field of Classification Search
CPC ........... H01L 21/0262; H01L 21/02628; C30B 25/14; C30B 29/16
See application file for complete search history.

(56) References Cited

U.S. PATENT DOCUMENTS

| | | | | |
|---|---|---|---|---|
| 12,286,449 | B2 * | 4/2025 | Fang | C07F 5/00 |
| 12,473,316 | B2 * | 11/2025 | Leoncini | C23C 16/45527 |
| 2004/0175509 | A1 * | 9/2004 | Kolics | H01L 21/76849 427/443.1 |
| 2017/0027731 | A1 * | 2/2017 | Jonsson | A61F 5/32 |
| 2018/0369861 | A1 * | 12/2018 | Katori | C23C 16/4481 |
| 2019/0189441 | A1 * | 6/2019 | Fujita | H10D 10/80 |
| 2019/0276477 | A1 | 9/2019 | Fang et al. | |
| 2020/0027731 | A1 * | 1/2020 | Nagaoka | C23C 16/4486 |

FOREIGN PATENT DOCUMENTS

| | | | | | |
|---|---|---|---|---|---|
| JP | 2005-340308 | | | 12/2005 | |
| JP | 2017088581 | A | * | 5/2017 | C07F 15/00 |
| JP | 2020-502044 | | | 1/2020 | |
| WO | WO-2005061522 | A1 | * | 7/2005 | C07F 15/0086 |
| WO | WO-2005117160 | A1 | * | 12/2005 | C09K 11/06 |
| WO | WO-2008153338 | A2 | * | 12/2008 | C07F 5/069 |
| WO | 2022/155090 | | | 7/2022 | |
| WO | 2023/032748 | | | 3/2023 | |

OTHER PUBLICATIONS

Partial European Search Report issued Sep. 17, 2024 in European Patent Application No. 24163193.6.

V.V. Krisyuk et al., "New heteroleptic copper(II) complexes as MOCVD precursors", Physics Procedia, 2013, vol. 46, pp. 174-182.

Yuxiang Zhang et al., "High growth per cycle thermal atomic layer deposition of Ni films using an electron-rich precursor", Nanoscale, 2019, vol. 11, pp. 3484-3488.

Partial European Search Report issued Dec. 23, 2025, in European Patent Application No. 25187818.7.

Ito, Yoshiaki, et al., "Kinetic and Equilibrium Studies on Substitution Reactions of the Chlorobis (β-diketonato)manganese(III) Complexes with Other B-Diketones," Bulletin Of the Chemical Society of Japan, Jan. 1, 1981, vol. 54, No. 1, pp. 150-158.

Yan, Xin, et al., "New MOCVD precursor for iridium thin films deposition," Materials Letters, May 5, 2006, vol. 61, No. 1, pp. 216-218.

* cited by examiner

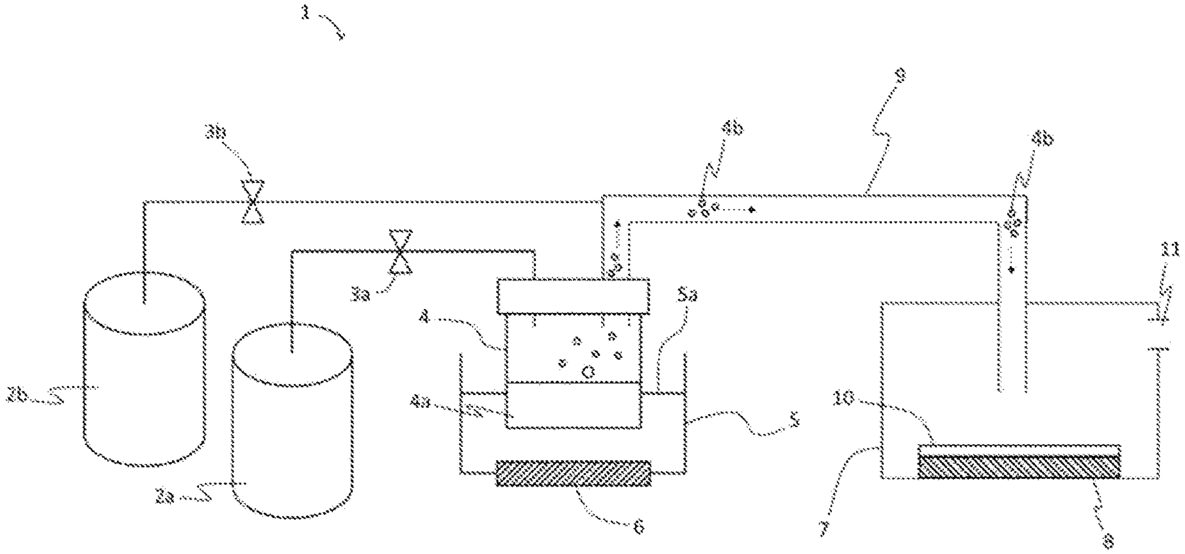
1
9
4b
4b
3b
3a
11
4
5a
2b
10
4a
5
2a
6
7
8

FILM FORMATION METHOD

CROSS REFERENCE TO RELATED APPLICATION

This application is a new U.S. patent application that claims priority benefits of Japanese Patent Application No. 2023-039132 (filed on Mar. 13, 2023)

The entire contents of the above applications, which the present application is based on, are incorporated herein by reference.

1. Field of the Invention

The present disclosure relates to a film formation method.

2. Description of the Related Art

Thin films made of insulating metal oxides, conductive metal oxides, and semiconductive metal oxides (also called oxide semiconductors) are used for various products such as semiconductor devices. In particular, semiconductor devices made of gallium oxide ($Ga_2O_3$) having a large band gap are attracting attention as next-generation switching elements that achieve high pressure resistance, low loss, and high heat resistance, and expected to be applied to semiconductor devices for power supply such as inverters. Moreover, the semiconductor devices made of gallium oxide are also expected to be applied to light-receiving/emitting devices such as light-emitting diode (LED) and sensors because of wide band gap.

In recent years, gallium oxide-based p type semiconductors have been investigated. For example, a substrate having p type conductivity is obtained by forming a $\beta$-$Ga_2O_3$ crystal by a floating zone (FZ) method using MgO (p type dopant source).

SUMMARY OF THE INVENTION

According to an example of the present disclosure, there is provided a film formation method using at least one of a metal complex having two or more different ligands, and a metal complex having same ligands and substituents.

Thus, the film formation method according to the present disclosure has excellent mass productivity.

BRIEF DESCRIPTION OF THE DRAWINGS

FIG. 1 is a block diagram of a film formation device (mist chemical vapor deposition (CVD) device) used in Examples.

DETAILED DESCRIPTION

Embodiments of the present disclosure will be described below with reference to the accompanying drawings. In the following description, the same parts and components are designated by the same reference numerals. The present embodiment includes, for example, the following disclosures.

In the film formation method according to the present disclosure, a metal film, particularly a metal oxide film is formed on a base. More specifically, the method is characterized in that a metal complex or a metal complex aqueous solution is used to form a metal oxide film. As a more specific example of the method, a metal oxide film is formed by using a film formation method in which a solution of a metal complex is atomized (mist CVD method) or applied respectively. The film formation method according to the present disclosure is excellent in mass productivity. Herein, the phrase "excellent in mass productivity" means that a time required for forming a film having a desired thickness is short.

The metal complex or the metal complex aqueous solution used in the film formation method according to the present disclosure will be explained below. Herein, the term "metal complex" means a compound containing a central metal and a ligand coordinated on the central metal.

The metal complex used for the film formation method according to the present disclosure is at least one of a metal complex having two or more different ligands and a metal complex having same ligands and substituents. Although not intended to restrict the interpretation, it is believed that the above metal complex has a higher solubility in solution (particularly water) than of conventional metal complexes due to particular ligands and substituents, resulting in a relatively high concentration of a solution for film formation, and therefore the metal complex is excellent in mass productivity.

In the present disclosure, a valence of the central metal in the metal complex is not particularly limited as long as the metal complex does not hinder the object of the present disclosure, and the central metal may be univalent, divalent, trivalent, or tetravalent. In the present disclosure, the central metal contains preferably a d-block metal in the periodic table or a Group 13 metal in the periodic table, more preferably a Group 9 metal or a Group 13 metal in the periodic table.

Note that the "periodic table" means the periodic table defined by International Union of Pure and Applied Chemistry (IUPAC). The "d-block" refers to elements having electrons satisfying the 3d, 4d, 5d, and 6d orbits.

The "Group 9 metal" only needs to be any Group 9 metal in the periodic table, such as iridium (Ir), cobalt (Co), rhodium (Rh), and two or more of these metals. The "Group 13 metal" is not particularly limited as long as the metal is any Group 13 metal in the periodic table. Examples of the Group 13 metal include aluminum (Al), gallium (Ga), indium (In), thallium (Tl), and two or more of these metals. In the present disclosure, one or a plurality of metals selected from aluminum (Al), gallium (Ga), and indium (In) are preferable.

Specific examples of the central metal include metals selected from gallium (Ga), iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), magnesium (Mg), calcium (Ca), arsenic (As), germanium (Ge), and zirconium (Zr).

Particularly, gallium (Ga), iridium (Ir), indium (In), and rhodium (Rh) are preferable from the view point of reactivity, availability or the like, furthermore iridium (Ir) is particularly preferable from the view point of aqueous solution-solubility, or the like.

In the present disclosure, it is possible to use at least one of a metal complex in which two or more different ligands are at least two ligands selected from a group consisting of an acetylacetonato-derived ligand, a ligand having a heterocyclic structure, and a ligand represented by the following formula (1), and a metal complex having the same ligands and substituents represented by the following formula (2).

[Formula 1]

(1)

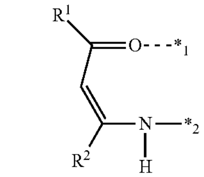

(2)

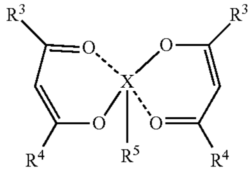

In the above formula (1), the dotted line represents a coordinate bond. *1 represents a coordinate bond position with a metal. *2 represents a bond position with a metal. Each of $R^1$ and $R^2$ independently represents an alkyl group having 1 to 6 carbon atoms.

In the above formula (2), each of $R^3$ and $R^4$ independently represents hydrogen atom, a halogen atom, an alkyl group having 1 to 6 carbon atoms, a phenyl group, or a tolyl group. $R^5$ represents a halogen atom, a formyl group, an acetoxy group, a sulfo group, a mesyl group, a nitro group, a nitroso group, a phosphoryl group, or an alkyl group having 1 to 6 carbon atoms. X represents a central metal. In this disclosure, the dotted line in each formula represents a coordination bond.

Examples of the ligand having the heterocyclic structure include pyridine, 2-methylpyridine, 2,4,6-trimethylpyridine, 4-dimethylaminopyridine, 2,6-lutidine, pyrimidine, pyridazine, pyrazine, oxazole, isoxazole, thiazole, isothiazole, imidazole, 1,2-dimethylimidazole, 3-(dimethylamino) propylimidazole, pyrazole, furazan, quinoline, isoquinoline, purine, 1H-indazole, quinazoline, cynoline, quinoxaline, phthalazine, pteridine, phenanthridine, 2,6-di-t-butylpyridine, 2,2'-bipyridine, 4,4'-dimethyl-2,2'-bipyridyl, 5,5'-dimethyl-2,2'-bipyridyl, 6,6'-di-t-butyl-2,2'-bipyridyl, 4,4'-diphenyl-2,2'-bipyridyl, 1,10-phenanthroline, 2,7-dimethyl-1,10-phenanthroline, 5,6-dimethyl-1,10-phenanthroline, and 4,7-diphenyl-1,10-phenanthroline.

The metal complex used in the present disclosure exhibits a high aqueous solution-solubility while having an excellent thermal stability. Furthermore, an aqueous solution containing such a metal complex does not precipitate during a long-term storage and is able to exhibit a high quality stability.

In particular, the metal complex having the ligand represented by the above formula (1) is allowed to be obtained by reacting a metal halide such as iridium trichloride with acetylacetonato in the presence of a water-soluble basic compound such as ammonia and tetramethylammonium hydroxide (TMAH).

Furthermore, the aqueous solution containing the metal complex is preferably within the range of pH 4.0 to 7.5. If the pH of the aqueous solution is lower than 4.0, there are tendencies that ligand exchange of the metal complex occurs, the aqueous solution-solubility decreases, and an amount of precipitated metal compound increases. If the pH of the aqueous solution is higher than 7.5, there is a tendency that formability of the thin film from the metal complex-containing aqueous solution deteriorates.

Preferably, the aqueous solution containing the metal complex according to the present disclosure is substantially free from organic solvents. This is because a flash point is lowered by organic solvents, and places and methods for using the organic solvents are restricted.

If the aqueous solution contains an organic solvent, an available organic solvent is preferably miscible with water as appropriate, such as methanol, ethanol, and isopropyl alcohol. An amount of the organic solvent is 10% by mass or less, more preferably 5% by mass or less based on the total amount of the solvents in the aqueous solution.

In particular, the metal is preferably iridium (Ir), and its metal complex is represented by the following formula (3) or formula (4).

[Formula 2]

(3)

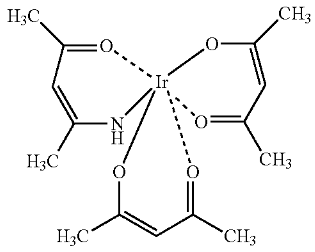

(4)

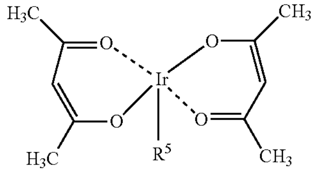

In the above formula (4), $R^5$ represents a halogen atom, an alkyl group having 1 to 6 carbon atoms, a formyl group, an acetoxy group, a sulfo group, a mesyl group, a nitro group, a nitroso group, or a phosphoryl group. Above all, chlorine atom is particularly preferable from the viewpoint of a compound stability during compound synthesis.

The metal complex represented by the above formula (3) is synthesized by alkali treatment of iridium trichloride in the aqueous solution. It has been confirmed that metal complexes other than the metal complex represented by formula (3) include compounds represented by the following formulas (3-1) and (4-1). Thus, the metal complex aqueous solution used in the present disclosure also contains a metal complex represented by at least one of the following formulas (3-1) and (4-1).

[Formula 3]

(3-1)

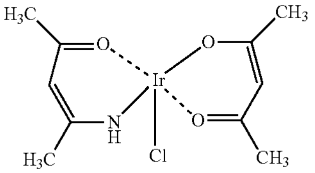

-continued (4-1)

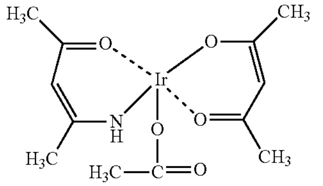

The metal complex according to the present disclosure may have counter cations in the aqueous solution. Examples of the counter cations include hydrogen ions and ammonium ions, and ammonium ions are particularly preferable. Ammonium ions become counter ions of the metal complex through neutralization using an alkaline aqueous solution such as ammonia water in the metal complex synthesis. When neutralization is performed using an aqueous solution of an acid such as hydrochloric acid, hydrogen ions become counter ions.

Examples of such a metal complex containing counter cations include metal complexes having counter cations, represented by the following formula (3-2) or (4-2).

[Formula 4]

(3-2)

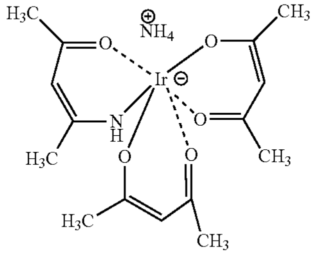

(4-2)

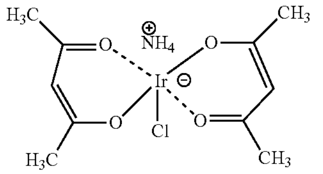

The film formation method using the metal complex according to the present disclosure will be explained below. Examples of the film formation method include an atomization method (mist CVD method) and a coating method.

<Atomization Method (Mist CVD Method)>

In the atomization method (mist CVD method), for example, a film formation device illustrated in FIG. 1 is used. The atomization method (mist CVD method) includes e.g. a step of atomizing or dropletizing a liquid containing the metal complex (atomization/dropletization step), a step of conveying the resulting mist or droplets to a base by a carrier gas (conveyance step), and a step of forming a metal oxide film on the base by thermally reacting the mist or droplets in the vicinity of the base (film formation step). The mist CVD method makes it possible to obtain a metal oxide film excellent in semiconductor characteristics and surface smoothness.

(Atomization/Dropletization Step)

In the atomization/dropletization step, a liquid containing the metal complex (raw material solution) is atomized or dropletized. An atomization or dropletization means for the raw material solution is not particularly limited as long as the means allows the raw material solution to be atomized or dropletized, and may be any known means. In the present disclosure, an atomization or dropletization means using ultrasonic waves is preferable. The mist or droplets obtained by using ultrasonic waves are preferable because the mist or droplets have zero initial velocity and are suspended in the air. For example, a mist that is conveyable as a gas suspending in a space rather than blowable like a spray is considerably suitable, because no damage is caused by collision energy. A mist particle diameter or a droplet size is not particularly limited and may be about several millimeters, but is preferably 50 μm or smaller, more preferably 100 nm to 10 μm.

(Raw Material Solution)

The raw material solution contains at least one of a metal complex having two or more different ligands and a metal complex having same ligands and substituents. The raw material solution is not particularly limited as long as it is possible to atomize or dropletize the raw material solution. The raw material solution may contain inorganic materials or organic materials. In the present disclosure, the raw material solution may contain, in addition to the metal complex, other complexes containing the metal in a form of a complex other than the metal complex or in a form of a salt. Other examples of the complex form include an acetylacetonato complex, a carbonyl complex, an ammine complex, and a hydride complex. Examples of the salt form include an organometallic salt (e.g. metal acetate, metal oxalate, metal citrate), a metal sulfide, a metal nitrate, a metal phosphate, a metal halide (e.g. metal chloride, metal bromide, metal iodide).

It is also preferable that the raw material solution is mixed with additives such as a hydrohalogenic acid and an oxidant. Examples of the hydrohalogenic acid include a hydrobromic acid, a hydrochloric acid, and a hydriodic acid. Above all, a hydrobromic acid or a hydrochloric acid is preferable because they are capable of forming better quality films. Particularly, hydrochloric acid is preferable. Examples of the oxidant include a peroxide such as hydrogen peroxide ($H_2O_2$), sodium peroxide ($Na_2O_2$), barium peroxide ($BaO_2$), and benzoyl peroxide $(C_6H_5CO)_2O_2$, a hypochlorous acid (HClO), perchloric acid, nitric acid, ozone water, and an organic peroxide such as peracetic acid and nitrobenzene. When the additive is a hydrochloric acid, a hydrochloric acid content in the raw material solution is preferably 1 to 20% by mass, more preferably 3 to 10% by mass.

The raw material solution may contain a dopant. When a dopant is contained in the metal complex aqueous solution, it is possible to perform desirable doping. The dopant is not particularly limited as long as it does not hinder the object of the present disclosure. Examples of the dopant include p type dopants such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N, and P. Typically, a concentration of the dopant may be about $1\times10^{16}/cm^3$ to $1\times10^{22}/cm^3$, or may be e.g. as low as about $1\times10^{17}/cm^3$ or lower. Furthermore, in the present disclosure, the concentration of the dopant may be as high as about $1\times10^{20}/cm^3$ or higher.

A solvent for the raw material solution may be an inorganic solvent such as water, an organic solvent such as alcohol, or a mixed solvent of inorganic and organic solvents. In the present disclosure, the solvent is preferably a water-containing solvent, more preferably water or a mixed solvent of water and alcohol, even more preferably water.

(Conveyance Step)

In the conveyance step, the mist or droplets obtained in the atomization/dropletization step are conveyed to the base by a carrier gas. The type of the carrier gas is not particularly limited as long as it does not hinder the object of the present disclosure. Examples of the carrier gas include oxygen, ozone, an inert gas such as nitrogen or argon, and a reducing gas such as hydrogen gas and forming gas, and, above all, an oxygen gas and/or ozone gas are preferable. One type or two types or more of carrier gases may be used, and a diluted gas with a carrier gas concentration changed (e.g. 10 time-diluted gas) or the like may be further used as a second carrier gas. The carrier gas may be supplied to not only one location but also two or more locations. A flow rate of the carrier gas is, but not particularly limited to, preferably 0.01 L/min to 20 L/min, more preferably 0.1 to 10 L/min.

The base is not particularly limited as long as it is capable of supporting the metal film, but a base having a corundum structure is preferable. A material for the base may be any known base, and may be an organic or inorganic compound. Preferable examples of the base material include metal oxides having a corundum structure, such as sapphire and α-gallium oxide. It is preferable that at least a part of the base including a crystal growth plane contains gallium as a major component. The term "major component" means a component contained at an atomic ratio of preferably 50% or higher, more preferably 70% or higher, even more preferably 90% or higher based on the total components of the base. The content of the major component may be 100%.

The base may have any shape and is effectively adaptable to all shapes. Examples of the shape include a plate shape such as a flat plate shape and a disc shape (hereinafter also referred to as "substrate"), a fibrous shape, a rod shape, a columnar shape, a prismatic shape, a cylindrical shape, a spiral shape, a spherical shape, and a ring shape. In the present disclosure, a substrate shape is preferable. A thickness of the substrate is not particularly limited in the present disclosure.

Preferably, the substrate has a corundum structure. Specific examples of the substrate include a sapphire substrate and an α-gallium oxide substrate. Herein, a principal plane of the substrate is preferably a plane inclined from c-plane, more preferably m-plane.

(Film Formation Step)

In the film formation step, the mist or droplets conveyed in the conveyance step are thermally reacted in the vicinity of the base to form a metal oxide film on the base. Metal oxide crystals or mixed crystals are formed by the thermal reaction to produce a metal oxide film. The upper limit of the thermal reaction temperature is preferably 900° C. or lower, more preferably lower than 600° C. In the film formation method according to the present disclosure, it is possible to form the metal oxide film even at a relatively low temperature of lower than 600° C. The film formation step may be executed under any atmosphere such as vacuum atmosphere, oxygen-free atmosphere, reducing gas atmosphere, or oxidizing atmosphere, and may be executed under atmospheric pressure condition, pressurized condition, or depressurized condition, as long as the object of the present disclosure is not hindered. However, in the present disclosure, the film formation step is executed preferably under an oxidizing atmosphere and under atmospheric pressure, more preferably under an oxidizing atmosphere and atmospheric pressure condition. The term "oxidizing atmosphere" is not particularly limited as long as the atmosphere allows metal oxide crystals or mixed crystals to be formed, and only needs to include oxygen or oxygen-containing compounds. Examples of the oxidizing atmosphere include an atmosphere including 1% or more of oxygen in an inert gas, an atmosphere including an oxygen-containing carrier gas, and an oxidizing atmosphere including an oxidant. Also, it is possible to set a film thickness by adjusting a film formation time. In the present disclosure, the film thickness is preferably 50 nm or larger, more preferably 100 nm or larger, most preferably 1.0 μm or larger. The upper limit of the film thickness is not particularly limited, but is preferably 1 mm, more preferably 100 μm. In the present disclosure, the metal oxide having the corundum structure may be p-type-doped by subjecting a metal complex including a p type dopant to this film formation step. Examples of the p type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N, P, and combinations of two or more of these elements. In the present disclosure, the p type dopant is preferably a Group 1 metal or Group 2 metal in the periodic table, more preferably a Group 2 metal, most preferably magnesium (Mg). In the present disclosure, the metal oxide film obtained in this step may be annealed.

<Coating Method>

In the coating method, the base is coated with a liquid containing a metal complex and dried to form a metal oxide film.

The liquid containing the metal complex (coating liquid) refers to a major compound raw material for forming the metal oxide film on the base, and a content of the metal complex in the liquid is preferably within a range of 1 to 30% by mass, more preferably 5 to 20% by mass. If the content is more than 30% by mass, the metal complex may easily precipitate to deteriorate stability of the coating liquid, or the obtained metallate film may become too thick, resulting in cracks.

If necessary, a small amount of one or more of an organic indium compound, an organic tin compound, and an organic zinc compound may added to the coating liquid. Furthermore, if necessary, an organic binder may be added to the coating liquid. The addition of the organic binder improves wettability to the base, and adjusts a viscosity of the coating liquid. The organic binder is preferably made of a material that burns or thermally decomposes during heat treatment. As this material, a cellulose derivative, an acrylic resin, and the like are effective.

Examples of the cellulose derivative used for the organic binder include methyl cellulose, ethyl cellulose, hydroxymethyl cellulose, hydroxyethyl cellulose, hydroxypropyl cellulose, hydroxyethylmethyl cellulose, hydroxypropylmethyl cellulose, ethylhydroxyethyl cellulose, carboxymethyl cellulose, carboxyethyl cellulose, carboxyethylmethyl cellulose, and nitrocellulose. Above all, hydroxypropyl cellulose (hereinafter referred to as "HPC" in some cases) is preferable.

As the above various cellulose derivatives and acrylic resins, many types having different molecular weights are commercially available. For example, as the HPC, a high molecular weight type, a medium molecular weight type, or a low molecular weight type may be used depending on the molecular weights. The larger the molecular weight is, the higher the viscosity of the metal complex aqueous solution containing the metal complex blended as a binder is. Selection of the molecular weight type and determination of the blending amount should be optimized as needed depending on a coatability of the coating liquid, a coating method, and a coating film thickness.

Generally, use of HPC makes it possible to acquire sufficient wettability at a content of 5% by mass or less, and to significantly adjust the viscosity. The combustion start temperature of HPC is about 300° C. Since HPC burns by a heat treatment at 300° C. or higher, preferably 350° C. or higher, it is possible to form a metal oxide film having a good conductivity without inhibiting growth of the produced conductive particles. If the HPC content is more than 5% by mass, HPC makes the coating liquid gelatinous and easily remains in the coating liquid to form an extremely porous metal film, significantly impairing transparency and conductivity.

Herein, when, for example, ethyl cellulose is used as a cellulose derivative instead of HPC, it is generally possible to set the viscosity of the coating liquid to lower than the viscosity of the coating liquid in the case of HPC, but pattern printability is slightly deteriorated in a screen printing method or the like for which a high viscosity coating liquid is suitable.

The solvent for the coating liquid may be an inorganic solvent such as water, an organic solvent such as alcohol, or a mixed solvent of inorganic and organic solvents. In the present disclosure, the solvent is preferably a water-containing solvent, more preferably water or a mixed solvent of water and alcohol, even more preferably water.

It is possible to add organic solvents other than the above-described water and alcohol to the coating liquid. Solvents blended for decreasing the viscosity of the coating liquid or for improving the coatability only need be compatible with solutions of various organometallic compounds, cellulose derivatives, or acrylic resins. Examples of the solvent other than the above-described solvents include, but are not limited to: ketone-based solvents such as acetone, methyl ethyl ketone (MEK), methyl propyl ketone, methyl isobutyl ketone (MIBK), cyclohexanone, and isophorone; ester-based solvents such as ethyl acetate, butyl acetate, isobutyl acetate, amyl formate, isoamyl acetate, butyl propanoate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropanoate, ethyl 3-oxypropanoate, methyl 3-methoxypropanoate, ethyl 3-methoxypropanoate, methyl 3-ethoxypropanoate, ethyl 3-ethoxypropanoate, methyl 2-oxypropanoate, ethyl 2-oxypropanoate, propyl 2-oxypropanoate, methyl 2-methoxypropanoate, ethyl 2-methoxypropanoate, propyl 2-methoxypropanoate, methyl 2-ethoxypropanoate, ethyl 2-ethoxypropanoate, methyl 2-oxy-2-methylpropanoate, ethyl 2-oxy-2-methylpropanoate, methyl 2-methoxy-2-methylpropanoate, ethyl 2-ethoxy-2-methylpropanoate, methyl pyruvate, ethyl pyruvate, propyl pyruvate, methyl acetoacetate, ethyl acetoacetate, methyl 2-oxobutanoate, and ethyl 2-oxobutanoate; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol methyl ether (PGM), propylene glycol ethyl ether (PE), propylene glycol methyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene, and dodecyl benzene; formamide (FA), N-methylformamide, dimethylformamide (DMF), dimethylacetamide, dimethylsulfoxide (DMSO), ethylene glycol, diethylene glycol, propylene glycol, dipropylene glycol, 1,3-butylene glycol, pentamethylene glycol, 1,3-octylene glycol, tetrahydrofuran (THF), chloroform, mineral spirits, terpineol, and mixtures of some of these solvents.

Since it is possible to adjust the viscosity of the coating liquid depending on a molecular weight and a content of the organic binder and a type of the solvent, the coating liquid is adaptable to various coating methods such as inkjet printing, screen printing, gravure printing, offset printing, flexographic printing, dispenser printing, slit coating, die coating, doctor blade coating, wire bar coating, spin coating, and spray coating, by adjusting the viscosity to a level suitable for each of these methods.

It is possible to prepare a high-viscosity (about 5000 to 50000 mPa·s) coating liquid by adding 5% by mass or less, preferably 2 to 4% by mass of a high-molecular weight organic binder. It is possible to prepare a low-viscosity (about 5 to 500 mPa·s) coating liquid by adding 5% by mass or less, preferably 0.1 to 2% by mass of a low-molecular weight organic binder and diluting the coating liquid with a low-viscosity dilution solvent. It is possible to prepare a medium-viscosity (500 to 5000 mPa·s) coating liquid by mixing a high-viscosity coating liquid and a low-viscosity coating liquid.

More specifically, the coating method includes a step of coating the base with the coating liquid to form a coating film (coating step), a step of drying the coating film to form a dried coating film (drying step), and a step of heating the dried coating film under an oxygen-containing atmosphere at a low dew point temperature to form the metal oxide film (heating step).

Examples of various methods for coating the base include inkjet printing, screen printing, gravure printing, offset printing, flexographic printing, dispenser printing, slit coating, die coating, doctor blade coating, wire bar coating, spin coating, and spray coating.

Preferably, these coating methods are performed under a clean atmosphere at a controlled temperature and humidity, such as a clean room. Typically, the temperature is room temperature (about 25° C.) and the humidity is 40 to 60% RH.

The base has been explained above in the section Atomization Method (Mist CVD Method).

In the drying step, the coating film is dried by preserving the base coated with the coating liquid typically at 80 to 180° C. in the atmosphere for 1 to 30 minutes, preferably 2 to 10 minutes to prepare a dried coating film.

The drying conditions (drying temperature, drying time) should be selected depending on the type of the base, the coat thickness, or the like as appropriate, and are not limited to the above-described drying conditions. However, in terms of the productivity, it is desirable to shorten the drying time to a minimum necessary time to prevent deterioration of the film quality of the resulting dried coating film.

The drying temperature must be lower than the heat-resistant temperature of the base, and e.g. in a case of a polyethylene naphthalate (PEN) film, the drying temperature must be set to about 200° C. or lower (depending on the drying time). If necessary, it is possible to apply a reduced-pressure drying (ultimate pressure: typically 1 kPa or lower) instead of the atmosphere drying. This reduced-pressure drying is useful when using a base made of a material having poor heat resistance and solvent resistance, because the drying proceeds while the applied solvent is forcibly removed under reduced pressure, allowing the coating film to be dried at a lower temperature than for the atmosphere drying.

The dried coating film is prepared by volatilizing and removing the organic solvent from the coating liquid, and is composed of organic components such as the above-described metal complex (a small amount of one or more of organoindium compounds, organotin compounds, and organozinc compounds (abbreviated as organometallic compounds A) may be added to the coating liquid as necessary) and organic binders.

In the heating step, the dried coating film prepared in the drying step is heated under an oxygen-containing atmosphere at a low dew point temperature to mineralize the metal complex in the dried coating film or a small addition amount of the organometallic compounds A and the metal complex, and organic components such as organic binders through thermal decomposition and combustion (oxidation) to form a dense inorganic film (metal oxide film as a metal oxide fine particle film, densely filled with metal oxide fine particles) composed of inorganic components (major components: metal oxides).

In other words, as the heating temperature increases in the temperature-raising stage of the heating step, the metal complex (or a small addition amount of the organometallic compounds A and the metal complex) in the dried coating film are gradually thermally decomposed and incinerated (oxidized), so that the organometallic compounds are first converted, so-called mineralized, into metal oxides in an amorphous state (referred to as a state of very fine particles having a crystallite size of smaller than 3 nm as determined by X-ray diffraction). Even if the heating temperature subsequently further increases to typically above a range of 300 to 330° C. or remains within the range of 300 to 330° C., the metal oxides crystallize by a prolonged heating time, and furthermore the crystals grow to become fine metal oxide particles, which are constituents for the final metal oxide film.

This temperature range of 300° C. to 330° C. refers to a general temperature range where mineralization and crystallization easily occur, and for example, if the heating time is long, mineralization, crystallization, and crystal growth of the metal oxides may occur even at about 270° C., and therefore the heating temperature in the heating step according to the present disclosure is not limited to 300° C. or higher.

On the other hand, although the organic binder is likewise gradually thermally decomposed and incinerated (oxidized) in the temperature-raising stage of the heating step, the organic binder is converted mainly to carbon dioxide ($CO_2$), volatilized into the atmosphere, and disappears from the film (e.g. the above-described HPC almost disappears at about 300 to 350° C., depending on a type of the organic binder), and therefore finally there is little organic binder remaining in the metal oxide film. However, a large amount of the organic binder remains until the initial stage of the heating step (a stage in the temperature-raising stage, during which the temperature is increased e.g. from room temperature to 300° C.), and the organic binder is uniformly interposed between the metal oxides in the amorphous state to suppress crystallization, but it is considered that, when the heat treatment is further advanced, the organic binder components gradually disappear, and thereby the metal oxides are crystallized.

The heating step will be explained below in more detail.

In the heating step for the dried coating film according to the present disclosure, first, an oxygen-containing atmosphere with a low dew point temperature i.e. a low water vapor content is used as an atmosphere for the temperature-raising stage, so that the crystallization and crystal growth of the metal oxides due to mineralization in the initial stage of the heating step as described above are suppressed to obtain a film structure of a metal oxide fine particle layer according to the present disclosure densely filled with the metal oxide fine particles. The mechanism for dense filling of the metal oxide fine particles is not necessarily clear, but is considered e.g. as follows.

In other words, until crystallization of the metal oxides is caused due to mineralization caused during the temperature-raising stage of the heating step (initial stage of the heating step; typically at about 300 to 330° C. in the present disclosure), the film structure with the organic binder uniformly interposed between the metal oxides in the amorphous state is maintained, and this film structure acquires flexibility by the action of the organic binder as an organic substance to allow the film to contract (densification) in a direction perpendicular to the substrate. Thus, it is assumed that, when the metal oxides are heated by raising the temperature under an air atmosphere with a low dew point temperature, the crystallization of the metal oxides is suppressed nearly up to a heating temperature at which the organic binder disappears (up to about 300 to 350° C.) to obtain a contractable film structure, leading to densification of the film.

<Metal Oxide Film>

The metal oxide film obtained by the above-described suitable formation method is industrially useful and excellent in electrical properties. More specifically, the metal oxide film typically has an electrical mobility of 1.0 $cm^2/V \cdot s$ or higher. The electrical mobility refers to a mobility determined Hall effect measurement, and is preferably 3.0 $cm^2/V \cdot s$ or higher in the present disclosure. Preferably the metal oxide film has a carrier density of $8.0 \times 10^{20}/cm^3$ or higher. Herein, the carrier density refers to a carrier density in a semiconductor film determined by Hall effect measurement. The lower limit of the carrier density is, but not particularly limited to, preferably about $1.0 \times 10^{15}/cm^3$ or higher, more preferably about $1.0 \times 10^{17}/cm^3$ or higher. In the present disclosure, it is easy to control the carrier density to within a range of $1.0 \times 10^{16}/cm^3$ to $1.0 \times 10^{20}/cm^3$ by adjusting the type and amount of the dopant or a material and content of the mixed crystal.

When the metal oxide film contains a mixed crystal, it is also preferable that the metal oxides contain iridium, a Group 2 metal in the periodic table, a Group 9 metal other than iridium, or a Group 13 metal. By using a preferable metal oxide as described above, it is possible to achieve a band gap of 2.4 eV or higher, furthermore 4.5 eV or higher, and therefore a p type oxide semiconductor is able to exhibit a wider band gap or a better electrical property. The "Group 2 metal" only needs to be any Group 2 metal in the periodic table. Examples of the Group 2 metal include beryllium (Be), magnesium (Mg), calcium (Ca), strontium (Sr), barium (Ba), and two or more of these metals.

The metal oxide film obtained as described above is suitably used as a p type semiconductor layer using a known means. In the present disclosure, the metal oxide film may be formed as it is on the base, but after other layers such as a semiconductor layer different from the p type semiconductor layer (e.g. n type semiconductor layer, n+ type semiconductor layer, n− type semiconductor layer), an insulator layer (including semi-insulator layer), and a buffer layer are laminated on the base, the metal oxide film may be formed on the base via the other layers. Examples of the semiconductor layer and the insulator layer include a semiconductor layer and an insulator layer, which contain the Group 13 metal. Preferable examples of the buffer layer include a semiconductor layer, an insulator layer, or a conductor layer, which include a corundum structure. Examples of the semiconductor layer including the corundum structure include $\alpha$-$Fe_2O_3$, $\alpha$-$Ga_2O_3$, and $\alpha$-$Al_2O_3$. The means for laminating the buffer layer is not particularly limited and may be the same as the means for forming the p type oxide semiconductor.

In the present disclosure, it is preferable to form the n type semiconductor layer before or after the film formation of the p type semiconductor layer. More specifically, it is preferable that the method of manufacturing the semiconductor device include a step of laminating at least the p type semiconductor layer and the n type semiconductor layer. The means for forming the n type semiconductor layer is not particularly limited and may be any known means, but the mist CVD method is preferable in the present disclosure. The major component of the n type semiconductor layer is preferably an oxide semiconductor, more preferably an oxide semiconductor containing a Group 13 metal (e.g. Al, Ga, In, Tl) in the periodic table. Also, the major component of the n type semiconductor layer is preferably a crystalline oxide semiconductor, more preferably a crystalline oxide semiconductor containing Ga, most preferably a crystalline oxide semiconductor having a corundum structure and containing Ga. In the present disclosure, a difference in lattice constant between the oxide semiconductor as the major component of the n type semiconductor and the p type oxide semiconductor is preferably 1.0% or lower, more preferably 0.3% or lower because the difference makes it possible to form a good p-n junction.

The "lattice constant difference" is defined as a percentage (%) determined by multiplying, by 100, an absolute value of a value obtained by dividing a value obtained by subtracting the lattice constant of the p type oxide semiconductor from the lattice constant of the oxide semiconductor as the major component of the n type semiconductor by the lattice constant of the p type oxide semiconductor. Examples of cases where the lattice constant difference is 1.0% or lower include a case where the p type oxide semiconductor has a corundum structure and the oxide semiconductor as the major component of the n type semiconductor also has a corundum structure, and more preferably a case where the p type oxide semiconductor is a single crystal or mixed crystal of $Ir_2O_3$ and the oxide semiconductor as the major component of the n type semiconductor is a single crystal or mixed crystal of $Ga_2O_3$. The term "major component" means an oxide semiconductor that is contained at an atomic ratio of preferably 50% or higher, more preferably 70% or higher, even more preferably 90% or higher based on the total component of the n type semiconductor layer, or may be contained at 100%. In the present disclosure, the p type oxide semiconductor may be monocrystalline or polycrystalline.

The metal oxide film obtained by various methods for forming metal oxide films as described above is usable as a p-type semiconductor layer for a semiconductor device, and useful particularly for power devices. Use of the metal oxide film for the semiconductor device makes it possible to suppress roughness scattering and to improve a channel mobility of the semiconductor device. It is possible to classify semiconductor devices into horizontal elements (horizontal devices) with electrodes formed on one side of a semiconductor layer, and vertical elements (vertical devices) with electrodes disposed on both sides of a semiconductor layer respectively. In the present disclosure, the semiconductor device is usable for both the horizontal devices and vertical devices, and particularly preferably for vertical devices. Examples of the semiconductor devices include schottky-barrier diode (SBD), metal semiconductor field effect transistor (MESFET), high electron mobility transistor (HEMT), metal oxide film semiconductor field effect transistor (MOSFET), electrostatic induction transistor (SIT), junction field effect transistor (JFET), insulated gate bipolar transistor (IGBT), and light-emitting diode.

EXAMPLES

The present disclosure will be specifically explained below based on Examples. The present disclosure is not limited to Examples.

[Film Formation by Mist CVD Method]

In this example, a film was formed by a mist CVD method.

Example 1

1. Manufacturing Device

A mist CVD device (cold wall type) used in Examples will be explained with reference to FIG. 1. A mist CVD device 1 includes a carrier gas source 2*a* that supplies a carrier gas, a flow rate regulation valve 3*a* that regulates a flow rate of the carrier gas supplied from the carrier gas source 2*a*, a carrier gas (diluted) source 2*b* that supplies the carrier gas (diluted), a flow rate regulation valve 3*a* that regulates a flow rate of the carrier gas (diluted) supplied from the carrier gas (diluted) source 2*b*, a mist generator 4 that contains a raw material solution 4*a* as a precursor solution, a container 5 that contains water 5*a*, an ultrasonic transducer 6 attached to a bottom of the container 5, a film formation chamber 7, a supply tube 9 that connects from the mist generator 4 to the film formation chamber 7, a hot plate 8 disposed in the film formation chamber 7, and an exhaust port 11 that discharges atomized droplets 4*b* and exhaust gas after a thermal reaction. Note that a base 10 is disposed on the hot plate 8.

2. Preparation of Raw Material Solution

A solution prepared by adding 3% by mass of hydrochloric acid to an aqueous solution containing iridium complexes represented by the following formula (3) and formula (4) (iridium (Ir) concentration: 0.01 mol/L) is mixed with a solution prepared by adding 3% by mass of hydrochloric acid to a gallium acetylacetonato (gallium (Ga) concentration: 0.01 mol/L) aqueous solution to prepare an aqueous solution. This aqueous solution was used as a raw material solution.

[Formula 5]

(3)

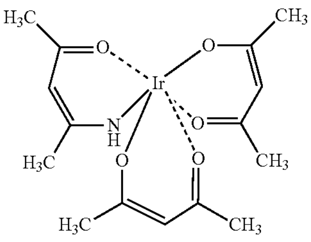

-continued (4)

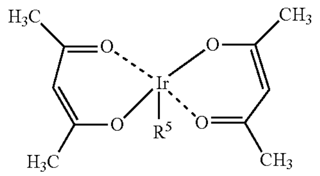

3. Preparation for Film Formation

The raw material solution 4*a* obtained in the above "2." was contained in the mist generator 4. Then, an m-face sapphire substrate as the base 10 was placed on the hot plate 8, and the temperature of the hot plate 8 was raised to heat the base 10 up to 500° C. Subsequently, the flow rate regulation valves 3*a* and 3*b* were opened to supply a carrier gas from the carrier gas source 2*a* and the carrier gas (diluted) source 2*b* respectively to the film formation chamber 7, the atmosphere inside the film formation chamber 7 was sufficiently replaced with the carrier gas, then flow rates of the carrier gas and the carrier gas (diluted) were regulated to 1.0 L/min and 1.0 L/min respectively. Herein, oxygen was used as the carrier gas.

4. Film Formation

Subsequently, the ultrasonic transducer 6 was vibrated, and the vibration was propagated to the raw material solution 4*a* through the water 5*a* to atomize the raw material solution 4*a* to produce the atomized droplets 4*b*. The atomized droplets 4*b* were conveyed to the film formation chamber 7 by the carrier gas, where the atomized droplets 4*b* are thermally reacted on the surface of the base 10 under atmospheric pressure at 500° C. to form a film on the base 10. The film formation time was 60 minutes. The film thickness was 130 nm.

As a result of identifying the film obtained in the above "4." using an X-ray diffractometer, the obtained film was composed of $\alpha$-(Ir, $Ga)_2O_3$. An Ir ratio in the metal elements in the film was 9.1%, and a Ga ratio in the metal elements in the film was 90.9%. A band gap of the film was estimated to be about 5.0 eV. The obtained film was confirmed to be a p type semiconductor by Hall effect measurement. As a result of evaluating an acceptor concentration from a capacitance-voltage (CV) measurement result, a carrier density was $1\times10^{19}/cm^3$. An evaluation result in the following <Evaluation of Mass Productivity> was "B".

Example 2

A film was obtained in the same manner as in Example 1 except that the concentration of iridium (Ir) in the aqueous solution containing the iridium complex represented by the above formula (3) was changed to 0.03 mol/L. The film thickness was 380 nm. As a result of identifying the obtained film using the X-ray diffractometer, the obtained film was composed of $\alpha$-(Ir, $Ga)_2O_3$. An Ir ratio in the metal elements in the film was 10.5%, and a Ga ratio in the metal elements in the film was 89.5%. A band gap of the film was estimated to be about 4.9 eV. The obtained film was confirmed to be a p type semiconductor by Hall effect measurement. As a result of evaluating an acceptor concentration from a CV measurement result, a carrier density was equivalent to that of the film obtained in Example 1. An evaluation result in the following <Evaluation of Mass Productivity> was "A".

Comparative Example 1

A film was obtained in the same manner as in Example 1 except that iridium acetylacetonato was used instead of the iridium complexes represented by the above formula (3) and formula (4), and as a result, iridium acetylacetonato was insoluble in water, and it was impossible to prepare an iridium acetylacetonato aqueous solution at the same concentration as in Example 1 (iridium concentration: 0.01 mol/L). Thus, the experiment was conducted in a system with an iridium acetylacetonato concentration reduced to one-tenth. Specifically, a solution prepared by adding 3% by mass of hydrochloric acid to an iridium acetylacetonato (iridium (Ir) concentration: 0.001 mol/L) aqueous solution is mixed with a solution prepared by adding 3% by mass of hydrochloric acid to a gallium acetylacetonato (gallium (Ga) concentration: 0.001 mol/L) aqueous solution to prepare an aqueous solution. This aqueous solution was used as a raw material solution. The film was formed in the same manner as in Example 1 except that the raw material solution and the film formation time were changed. As a result of identifying the obtained film using the X-ray diffractometer, the obtained film was composed of $\alpha$-(Ir, $Ga)_2O_3$. The film formation time was 180 minutes. The film thickness was 90 nm. An evaluation result in the following <Evaluation of Mass Productivity> was "C".

Example 3

An aqueous solution was prepared by adding 3% by mass of hydrochloric acid to a raw material containing the iridium complex (iridium concentration: 0.05 mol/L) represented by the above formula (3) and ultrapure water. This aqueous solution was used as a raw material solution. A film was formed in the same manner as in Example 1 except that the raw material solution was changed. The film thickness was 800 nm.

As a result of identifying the film obtained in Example 3 using the X-ray diffractometer, the obtained film was composed of $\alpha$-$Ir_2O_3$. The obtained film was confirmed to be a p type semiconductor by Hall effect measurement. An evaluation result in the following <Evaluation of Mass Productivity> was "A".

<Evaluation of Mass Productivity>

A progress status of film formation in a mist CVD method for 60 minutes was evaluated. When it was possible to form a thicker film in 60 minutes, the mass productivity may be rated as excellent. A film thickness of a metal oxide film obtained after the film formation reaction for 60 minutes was measured using a spectroscopic ellipsometer (model number: SE-2000, manufactured by Semilab Inc.).

When the film thickness was 250 nm or larger, the film was rated as excellent and evaluated as "A".

When the film thickness was within a range of larger than 100 nm and smaller than 250 nm, the film was as rated as good and evaluated as "B".

When the film thickness was 100 nm or smaller, the film formation was rated as poor and evaluated as "C".

[Film Formation by Coating Method]

In this example, a film was formed by a coating method.

Example 4

1. Preparation of Coating Liquid

The aqueous solution containing the iridium complex (iridium concentration: 0.01 mol/L) used in Example 1 was used as a coating liquid.

2. Preparation of Metal Oxide Film

The coating liquid was applied on an entire surface of a sapphire substrate by spin coating (1000 rpm×60 sec) under atmospheric pressure at 25° C., and then dried in the atmosphere at 150° C. for 10 minutes to obtain a dried coating film (film thickness: about 300 nm). This coating film was heated in the atmosphere at 550° C. for 6 hours to obtain a metal oxide film. An evaluation result of the following <Evaluation of Metal Oxide Film Surface Roughness> was "A".

Comparative Example 2

A metal oxide film was prepared in the same manner as in Example 4 except that the aqueous solution containing iridium acetylacetonato (iridium concentration: 0.001 mol/L) used in Comparative Example 1 was used as a coating liquid. An evaluation result of the following <Evaluation of Metal Oxide Film Surface Roughness> was "C".

<Evaluation of Metal Oxide Film Surface Roughness>

A surface roughness (Ra) of the obtained film was observed using a scanning atomic force microscope (AFM, model number: Dimension Fastscan/Icon, manufactured by Bruker Corporation). The surface roughness was evaluated according to the following criteria.

When the surface roughness value was within a range of 1 nm or larger and smaller than 3 nm, the surface roughness was rated as excellent and evaluated as "A".

When the surface roughness value was within a range of 3 nm or larger and smaller than 5 nm, the surface roughness was rated as good and evaluated as "B". When the surface roughness value was 5 nm or larger, the surface roughness was rated as poor and evaluated as "C".

The results of Examples and Comparative Examples show that the metal oxide film obtained by the formation method according to the present disclosure is industrially useful because of its excellent film properties such as surface smoothness and crystallinity, and also excellent in electrical properties such as electrical mobility.

APPENDIX

[Section 1]

A film formation method using at least one of a metal complex having two or more different ligands, and a metal complex having same ligands and substituents.

[Section 2]

The film formation method according to section 1, in which the two or more different ligands are at least two ligands selected from a group consisting of a ligand derived from acetylacetonato, a ligand having a heterocyclic structure, and a ligand represented by the following formula (1), and the metal complex having the same ligands and substituents is represented by the following formula (2).

[Formula 6]

(1)

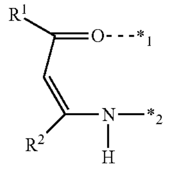

-continued (2)

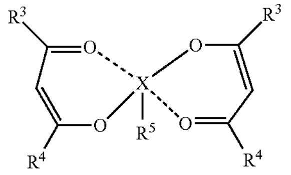

(in formula (1), the dotted line represents a coordinate bond, *1 represents a coordinate bond position with a metal, *2 represents a bond position with a metal, each of $R^1$ and $R^2$ independently represents an alkyl group having 1 to 6 carbon atoms, in formula (2), each of $R^3$ and $R^4$ independently represents hydrogen atom, a halogen atom, an alkyl group having 1 to 6 carbon atoms, a phenyl group, or a tolyl group, $R^5$ represents a halogen atom, a formyl group, an acetoxy group, a sulfo group, a mesyl group, a nitro group, a nitroso group, a phosphoryl group, or an alkyl group having 1 to 6 carbon atoms, and X represents a central metal.)

[Section 3]

The film formation method according to section 2, in which a central metal coordinated in the metal complex having the two or more different ligands, and the central metal represented by X in the metal complex represented by formula (2) contain a d-block metal or a Group 13 metal in the periodic table.

[Section 4]

The film formation method according to section 3, in which the central metals contain a Group 9 metal or Group 13 metal in the periodic table.

[Section 5]

The film formation method according to any one of sections 2 to 4, in which the central metals are iridium.

[Section 6]

The film formation method according to section 5, in which the metal complex having iridium as the central metal is represented by the following formula (3) or formula (4).

[Formula 7]

(3)

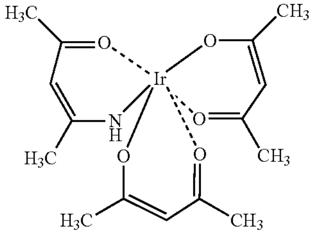

(4)

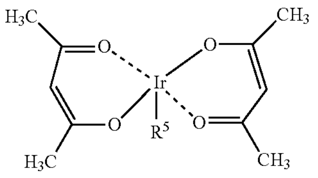

(in formula (4), $R^5$ represents a halogen atom, a formyl group, an acetoxy group, a sulfo group, a mesyl group, a nitro group, a nitroso group, a phosphoryl group, or an alkyl group having 1 to 6 carbon atoms.)

[Section 7]

The film formation method according to any one of sections 1 to 6, in which a metal oxide film is formed using the metal complex as a raw material.

[Section 8]

The film formation method according to section 7, in which the metal oxide film includes a crystalline oxide semiconductor.

[Section 9]

The film formation method according to any one of sections 1 to 8, in which the metal complex is supplied onto a base having a corundum structure.

[Section 10]

The film formation method according to section 9, in which at least a part of the base including a crystal growth plane contains gallium as a major component.

[Section 11]

The film formation method according to any one of sections 1 to 10, including a step of atomizing or dropletizing a liquid containing the metal complex, a step of conveying resulting mist or droplets to the base by a carrier gas, and a step of forming the metal oxide film on the base by thermally reacting the mist or droplets in the vicinity of the base.

[Section 12]

The film formation method according to any one of sections 1 to 10, including a step of forming the metal oxide film on the base by applying the liquid containing the metal complex on the base, followed by drying.

[Section 13]

The film formation method according to any one of sections 1 to 12, in which the metal complex is contained in a liquid raw material, and the raw material further contains gallium.

[Section 14]

The film formation method according to any one of sections 1 to 12, in which the metal complex is contained in the liquid raw material, and the raw material further contains a p type dopant.

The embodiments of the present invention are exemplified in all respects, and the scope of the present invention includes all modifications within the meaning and scope equivalent to the scope of claims.

REFERENCE SIGNS LIST

1 Mist CVD device
**2*a*** Carrier gas source
**2*b*** Carrier gas (diluted) source
**3*a*** Flow rate regulation valve
**3*b*** Flow rate regulation valve
4 Mist generator
**4*a*** Raw material solution
**4*b*** Atomized droplets
5 Container
**5*a*** Water
6 Ultrasonic transducer
7 Film formation chamber
8 Hot plate
9 Supply tube
10 Base
11 Exhaust port

What is claimed is:

1. A film formation method, the method comprising steps of:

atomizing or dropletizing a liquid containing a metal complex, the metal complex being at least one of:

a metal complex having two or more different ligands, and a metal complex having same ligands and substituents;

conveying a resulting mist or droplets to a base by a carrier gas; and forming a metal oxide film on the base by thermally reacting the mist or droplets in the vicinity of the base, wherein the two or more different ligands include at least one ligand represented by following formula (1) and at least one ligand selected from a group consisting of a ligand derived from acetylacetonato, a ligand having a heterocyclic structure, and the ligand represented by following formula (1), and in following formula (1), the dotted line represents a coordinate bond, *1 represents a coordinate bond position with a metal, *2 represents a bond position with a metal, and each of $R^1$ and $R^2$ independently represents an alkyl group having 1 to 6 carbon atoms, the metal complex having the same ligands and substituents is represented by following formula (2), and in following formula (2), the dotted line represents a coordinate bond, each of $R^3$ and $R^4$ independently represents hydrogen atom, a halogen atom, an alkyl group having 1 to 6 carbon atoms, a phenyl group, or a tolyl group, $R^5$ represents a halogen atom, a formyl group, an acetoxy group, a sulfo group, a mesyl group, a nitro group, a nitroso group, a phosphoryl group, or an alkyl group having 1 to 6 carbon atoms, and X represents a central metal (1)

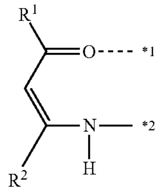

(2)

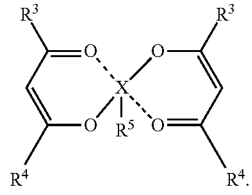

.

2. The film formation method according to claim 1, wherein a central metal coordinated in the metal complex having the two or more different ligands, and the central metal represented by X in the metal complex represented by formula (2) are each, independently, a d-block metal or a Group 13 metal in the periodic table.

3. The film formation method according to claim 2, wherein the central metals contain a Group 9 metal in the d-blocker.

4. The film formation method according to claim 2, wherein the central metals are iridium.

5. The film formation method according to claim 4, wherein the metal complex having iridium as the central metal is represented by the following formula (3) or formula (4), in formula (3) and (4), the dotted line represents a coordinate bond, and in formula (4), $R^5$ represents a halogen atom, a formyl group, an acetoxy group, a sulfo group, a mesyl group, a nitro group, a nitroso group, a phosphoryl group, or an alkyl group having 1 to 6 carbon atoms (3)

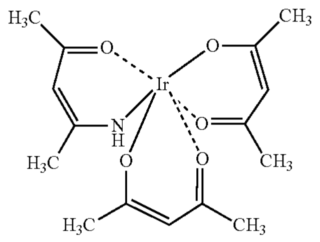

(4)

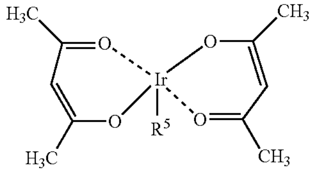

.

6. The film formation method according to claim 1, wherein a metal oxide film is formed using the metal complex as a raw material.

7. The film formation method according to claim 6, wherein the metal oxide film comprises a crystalline oxide semiconductor.

8. The film formation method according to claim 1, wherein the base has a corundum structure.

9. The film formation method according to claim 8, wherein at least a part of the base comprises a crystal growth plane containing gallium as a major component.

10. The film formation method according to claim 1, wherein the metal complex is contained in a liquid raw material, and the raw material further contains gallium.

11. The film formation method according to claim 1, wherein the metal complex is contained in the liquid raw material, and the raw material further contains a p type dopant.

12. A film formation method, the method comprising a step of forming a metal oxide film on a base by applying a liquid containing a metal complex on the base, followed by drying, wherein the metal complex is at least one of:

a metal complex having two or more different ligands, and a metal complex having same ligands and substituents, the two or more different ligands include at least one ligand represented by following formula (1) and at least one ligand selected from a group consisting of a ligand derived from acetylacetonato, a ligand having a heterocyclic structure, and the ligand represented by following formula (1), and in following formula (1), the dotted line represents a coordinate bond, *1 represents a coordinate bond position with a metal, *2 represents a bond position with a metal, and each of $R^1$ and $R^2$ independently represents an alkyl group having 1 to 6 carbon atoms, the metal complex having the same ligands and substituents is represented by following formula (2), and in following formula (2), the dotted line represents a coordinate bond, each of $R^3$ and $R^4$ independently represents hydrogen atom, a halogen atom, an alkyl group having 1 to 6 carbon atoms, a phenyl group, or a tolyl group, R' represents a halogen atom, a formyl group, an acetoxy group, a sulfo group, a mesyl group, a nitro group, a nitroso group, a phosphoryl group, or an alkyl group having 1 to 6 carbon atoms, and X represents a central metal (1)

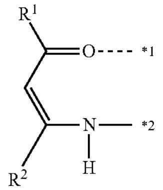

(2)

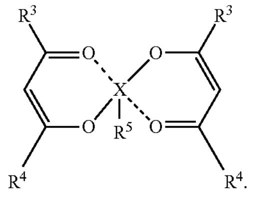

* * * * *